United States Patent [19]
Heuner et al.
[11] 3,916,430
[45] Oct. 28, 1975

[54] SYSTEM FOR ELIMINATING SUBSTRATE BIAS EFFECT IN FIELD EFFECT TRANSISTOR CIRCUITS

[75] Inventors: Robert Charles Heuner, Bound Brook; David Keith Morgan, Flemington, both of N.J.; Goetz Wolfgang Steüdel, Stuttgart, Germany

[73] Assignee: RCA Corporation, New York, N.Y.

[22] Filed: Mar. 14, 1973

[21] Appl. No.: 341,058

[52] U.S. Cl. ............... 357/42; 357/41; 307/DIG. 1; 307/270; 307/279; 307/304

[51] Int. Cl.[2] .................... H01L 27/02; H03K 1/00; H03K 3/26; H03K 3/353

[58] Field of Search ........... 317/235, 22.2; 307/303, 307/238, 214, 279, 304, 251

[56] References Cited

UNITED STATES PATENTS

| | | | |
|---|---|---|---|
| 3,653,002 | 3/1972 | Goffee | 317/235 |
| 3,665,423 | 5/1972 | Nakanuma et al. | 317/235 X |
| 3,712,995 | 1/1973 | Steudel | 317/235 X |

*Primary Examiner*—John S. Heyman
*Assistant Examiner*—E. Wojciechowicz
*Attorney, Agent, or Firm*—H. Christoffersen; H. I. Schanzer

[57] ABSTRACT

An integrated circuit, formed on a common substrate, having one portion operated from a first source of operating potential and another portion operated from a second source of operating potential. Separate wells are diffused in said substrate for the connection thereto of the different voltages and a reference potential common to the two sources of operating potential is applied to the common substrate. Transistors having a given potential applied to their source electrodes are formed in the common substrate or in a well having the same given potential connected thereto for eliminating potential differences between the source and the substrate of the transistors.

7 Claims, 3 Drawing Figures

SYSTEM FOR ELIMINATING SUBSTRATE BIAS EFFECT IN FIELD EFFECT TRANSISTOR CIRCUITS

This invention is directed to monolithic field effect integrated circuits having two or more power supplies.

It is often necessary and/or desirable to operate different parts of an electronic system at different voltage levels. At the places where the different parts meet, they must be coupled to each other. However, the signals at the interfaces are not necessarily compatible. It is, therefore, necessary to provide interface and level shift circuits which can render one part of the system compatible with the other.

The design of interface circuits, however, is made more difficult when the active devices of the electronics system are formed on a single monolithic substrate. Some of the difficulties may be seen by referring to the prior art circuit of FIG. 1 which shows a typical integrated complementary metal oxide semiconductor (CMOS) circuit. FIG. 1 illustrates that transistors in an interface circuit may be subjected to a considerable reverse bias between their source electrodes and their substrates giving rise to serious problems.

In FIG. 1 the output of a first logic circuit 120 operated from a 3 volt power supply is coupled to a second logic circuit 140 operated from a 15 volt power supply by means of a circuit comprised of inverters 11, 12 and 13. The operating potential for interter I1 is the same 3 volt source as for circuit 120. Inverter I1 inverts the output from circuit 120 and applies it to the input of inverter I2 (gate of transistor N2). The operating potential for inverters I2 and I3 is the same 15 volt source as for circuit 140. Inverters 12 and 13 are cross-coupled and supply a signal varying between ground and 15 volts to circuit 140 in response to the complementary 3 volt level signals applied to their inputs (gates of transistors N2 and N3).

FIG. 1 shows schematically that all the P-type transistors (P1, P2 and P3) share the same substrate, 150, to which is applied the highest system potential (15 volts) and that the substrates of all the N-type transistors (N1, N2 and N3) are returned to the lowest system potential (ground). Note, however, that the sources of the transistors may be operated at different potentials than their substrate region. Specifically, transistor P1 has its source connected to 3 volts while its substrate is at 15 volts.

Operating the source electrodes of transistors at one potential while connecting their substrate to a different potential creates serious problems. The threshold voltage ($V_T$) of a field effect transistors is defined as the gate to source potential which must be exceeded to turn the transistor on. The $V_T$ is dependent on the potential applied between the source and the substrate of the transistor. A reverse bias applied between the source and the substrate increases the $V_T$ of the transistor. Depending on the resistivity of the substrate material, the $V_T$ may increase above its nominal value at zero source to substrate bias by an amount varying from 0.2 volts per volt of reverse bias to 1 volt per volt of reverse bias.

The $V_T$ of transistor P1 may be, for example 2 volts when the source and the substrate are connected in common (i.e. zero reverse bias). However, with a reverse bias of 12.0 volts applied between the source and the substrate, as in FIG. 1, the $V_T$ increases to a value which may range from 4 volts to more than 10 volts. Clearly, if the $V_T$ of transistor P1 is 4 volts the gate to source potential necessary to turn it "on" must be equal to or greater than 4 volts. However, transistor P1 is part of a circuit operated from the 3 volt power supply. Also, the signals applied to the gate of transistor P1 are derived from circuits operated from the 3 volt power supply and will also vary from zero volts to a maximum of 3 volts. Accordingly, transistor P1 cannot be turned on and the circuit is thereby rendered partly or wholly inoperative.

The problem of increasing $V_T$ is even more acute in circuits where the transistors are designed to operate at very low voltages such as 1.5 volts or less. Another problem is that even where the $V_T$ of the transistor is not increased beyond the operating range, a reverse bias increases the "on" impedance of the transistor thereby altering the turn on and turn off time of the circuit.

Circuits embodying the invention are formed on a common substrate and a different well region is provided for each different operating potential applied to the circuit. Transistors having their source electrodes connected to a given potential are formed in a well or in the common substrate having the same given potential applied thereto. Circuits can thereby be formed in which all the active components have zero reverse bias between their source and substrate.

In the accompanying drawings like reference numerals denote like components; and FIG. 1 is a schematic diagram of a prior art circuit;

Figure 2:
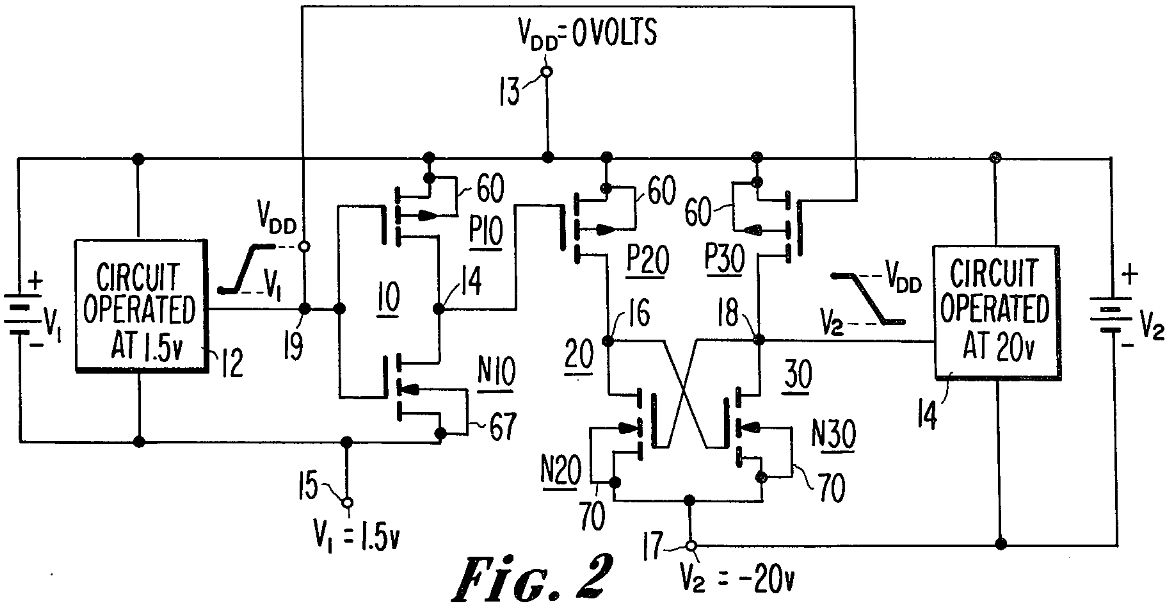
FIG. 2 is a schematic diagram of a circuit embodying the invention.

In FIG. 2, the circuit 12 is connected across a first power supply of V1 volts and produces output signals at terminal 19 which vary between V1 volts and $V_{DD}$ volts. Circuit 12 may be any one of a number of known logic or analog circuits whose output signals are to be coupled to another circuit 14 which may also be a logic or analog circuit or a display device or any other type of load device. Circuit 14 is connected across a second power supply of V2 volts and requires input signals of an amplitude varying between $V_{DD}$ volts and V2 volts. By way of example, $V_{DD}$ volts is ground potential, V1 volts is −1.5 volts and V2 volts is −20 volts.

The output of circuit 12 is level shifted by means of inverters 10, 20 and 30 for producing signals suitable to drive circuit 14. Each inverter includes a P-type transistor and an N-type transistor denoted by a P and an N, respectively, with a numerical subscript corresponding to its associated inverter. The gates of transistors P10 and N10 are connected to terminal 19 to which the output of circuit 12 is applied. The substrate 60 and the source of transistor P10 are connected to a terminal 13 to which is applied a potential of $+V_{DD}$ volts. The drain of transistor P10 is connected to the drain of transistor N10 at terminal 14. The source and substrate, 67, of transistor N10 are connected to a terminal 15 to which is applied a potential of V1 volts.

The sources and the substrate, 60, of transistors P20 and P30 are connected to terminal 13. The gates of transistors P20 and P30 are connected to terminals 14 and 19, respectively. The drains of transistors P20 and N20 are connected to the gate of the transistor N30 at output terminal 16 and the drains of transistors P30 and N30 are connected to the gate of transistor N20 at output terminal 18. The sources and the substrate, 70, of transistors N20 and N30 are connected to terminal 17 to which is applied a potential of V2 volts. Output terminal 18 is connected to circuit 14. Obviously output 16 could, similarly to terminal 18, be used to drive an output circuit.

Figure 3:
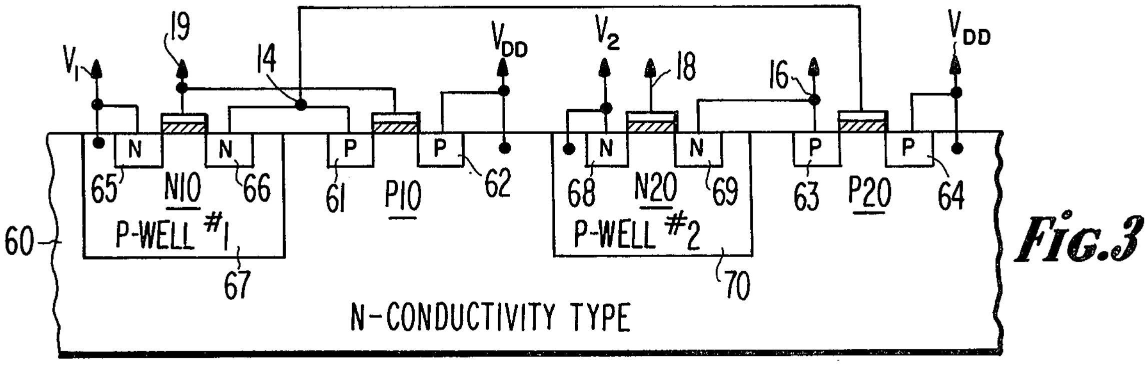
FIG. 3 is a cross section of a portion of the circuit of FIG. 2.

The circuit of FIG. 2 may be formed as shown, in part, in FIG. 3. The common substrate, 60, is a body of semiconductor of N-conductivity type material in which are diffused regions (61, 62, 63, 64, 67 and 70) of P-conductivity type. P-regions 61 and 62 form the source and drain regions of P-conductivity type transistor P10 and P-regions 63 and 64 form the source and drain regions of P-conductivity type transistor P20. The N-conductivity type transistors are formed in P-regions 67 and 70, denoted P-well No. 1 and No. 2, respectively. N-regions 65 and 66 diffused in P-region 67 form the source and drain regions of transistor N10, and N regions 68 and 69 form the source and drain regions of transistor N20. Transistor N30 (not shown in FIG. 3) would preferably have its source and drain formed in the same P-well as transistor N20.

Overlying the path between the source and drain regions is an insulator layer such as silicon dioxide over which is formed a gate electrode. The potential applied to the gate electrode controls the conductivity of the channel region. The gate region of transistor N10 is shown connected to the gate of transistor P10; the two gates being connected in common to terminal 19.

Region 65 defined as the source of transistor N10 is connected to P-region 67 (which is the local substrate of transistor N10) and to the source of potential V1. The drain 61 of transistor P10 is connected to the drain 66 of transistor N10 and to the gate of transistor P20 at terminal 14. The source 68 of transistor N20 is connected to P-region 70 (which is the local substrate of transistor N20) to the potential V2. The gate electrode of transistor N20 is connected to terminal 18. Drain region 69 of transistor N20 is connected to drain region 63 of transistor P20 at terminal 16. The source regions 62 and 64 of transistors P10 and P20 are connected to the semiconductor body 60 (which is the local substrate of these transistors) to the potential $V_{DD}$.

As indicated in FIGS. 2 and 3, all the P-type transistors (P10, P20, P30) have their sources and their common substrate 60 connected to a common point of potential ($V_{DD}$). Transistor N10 has its source and its local substrate, P-well region 67, connected to a potential (V1) and transistors N20 and N30 have their sources and their local substrate, P-well region 70, connected to a potential V2. Thus, each transistor has its source connected to the same potential as its well or substrate. Operating the transistors with zero volts between their sources and substrates ensures that the threshold voltage of the devices is not increased above its nominal value at zero reverse bias. This permits the design of circuits and their reliable operation at values of operating potential which are nearly equal to the value of the threshold voltage. That is, a device with a $V_T$ of 1 volt can be operated from a 1.3 volt or 1.5 volt supply. It also permits the design of interface circuits between circuits operating at widely different potentials. This technique is also extremely valuable for use in conjunction with circuits operating at extremely low voltages (e.g. 1.5 volts) where a small increase in $V_T$ may render the circuit inoperable or marginally operable.

In contrast to the priot art circuitry, each transistor, in circuits embodying the invention, has its source connected to the same potential as its substrate. Also in contrast to the prior art, the common substrate is maintained at a fixed potential and the well-regions are designed to receive the different voltage levels applied to the circuit. These features enable, in part, the design of circuits in which no transistor is subjected to a reverse bias between its source and substrate.

Figure 1:
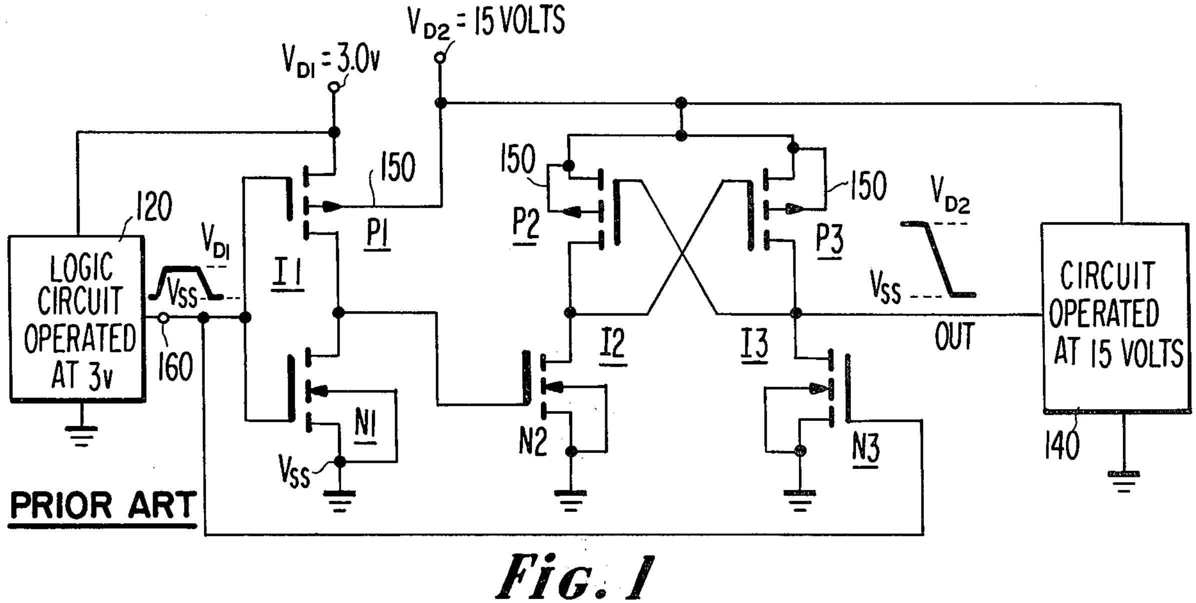

In prior art circuits where transistors formed on a common substrate are operated at different potentials it is possible for the source region of some transistors to be forward biased with respect to their substrate resulting in catastrophic failure. For example, in FIG. 1, if a $V_{D1}$ of 3 volts is applied to the source of transistor P1 while $V_{D2}$ is at ground, the source-to-substrate region of transistor P1 has 3 volts connected across. The source-to-substrate region so biased presents a low impedance forward biased junction between two power supplies ($V_{D1}$ and $V_{D2}$) allowing a large current to pass therethrough. The current may be so high that the region burns out or the metal connected thereto melts. In contrast thereto, in circuits embodying the invention, the sources of the transistors are at the same potential as their substrate and regions at different potentials are isolated from each other. As a result, there cannot be a condition of forward bias between a source region and a substrate. Accordingly, the possible destruct condition present in the prior art is eliminated.

Returning to FIG. 2, the operation of the circuit is best explained by assuming that $+V_{DD}$ volts is ground potential (0 volts), that V1 is −1.5 volts, and that V2 is −20 volts. In addition, assume that the $V_T$ of the P type and the N type transistors with zero source to substrate bias is 1.0 volts. Assume, also, that the input signals present at terminal 19 vary between 0 volts ($V_{DD}$) and −1.5 volts (V1).

A signal of zero volts applied to terminal 19 turns off transistor P30 while causing transistor N10 to conduct thereby clamping terminal 14 to −1.5 volts. Under this condition, −1.5 volts is applied to the gate of transistor P20 while zero volts is applied to the gate of transistor P30. Transistor P20, with 1.5 volts between its gate and source, conducts causing terminal 16 to rise in potential towards zero volts. The rising potential at terminal 16 turns on transistor N30 which clamps terminals 18 to −20 volts. Thus, the zero volt level signal present at terminal 19 results in the production of a zero volt level signal at terminal 16 and a signal level of −20 volts at terminal 18.

In response to the presence of a −1.5 volt level signal at terminal 19, transistor P10 is turned on and transistor N10 is turned off. In the circuit of FIG. 2 the $V_T$ of P10 remains at its low value of 1.0 volts since the source and the substrate are tied in common to 0 volts. Therefore, when −1.5 volts is applied to its gate, transistor P10 is turned fully on. With transistor P10 turned on, zero volts is applied to terminal 14 which cuts off transistor P20. Concurrently, the −1.5 volts applied to input terminal 19 turns on transistor P30. Transistor P30 when turned on applies zero volts to terminal 18 which turns on transistor N20 which clamps terminal 16 to −20 volts. With output terminal 16 clamped to −20 volts, transistor N30 is cut off. Therefore, terminal 16 is at −20 volts while terminal 18 is at zero volts in response to the −1.5 volt level at terminal 19.

The signals at terminals 16 and 18 are thus −20 volts and 0 volts, respectively, when the signal at terminal 19 is −1.5 volts and the signals at terminals 16 and 18 are zero volts and −20 volts, respectively, when the signal at terminal 19 is 0 volts.

It has thus been shown that in circuits embodying the invention, a low level input signal may be level shifted to produce a much larger output signal with little power dissipation and with a minimum number of components. The low power dissipation results both from the type of circuit (complementary symmetry) and from the fact that the input signals may be low level signals obtained from a low power circuit.

What is claimed is:

1. A field effect integrated circuit which in response to signals varying between a first voltage level and a reference potential produces signals varying between said reference potential and a second voltage level comprising:

a semiconductor body of first conductivity type having embedded therein regions of second conductivity type for forming the sources and the drains of transistors of second conductivity type and at least two well-regions of said second conductivity type also embedded within said semiconductor body with regions of first conductivity type embedded within said well-regions for forming the sources and the drains of transistors of first conductivity type;

means for applying said reference potential to said substrate;

means for applying said first voltage level to one of said well-regions;

means for applying said second voltage level, where said second voltage level is different than said first voltage level, to a second one of said well-regions; and means connecting the source of each transistor to the substrate or well region in which it is formed for eliminating any reverse bias between the source and the semiconductor or wellregion in which the transistor is formed.

2. The combination as claimed in claim 1 wherein at least one transistor of first conductivity type from each of said well-regions has its drain electrode connected to the drain of a transistor of second conductivity type formed in said semiconductor body for forming a complementary inverter.

3. The combination as claimed in claim 2 wherein said transistors are insulated-gate field-effect transistors; wherein said first conductivity type is N-type conductivity and said second conductivity type is P-type conductivity; and wherein said second voltage level is of same polarity as but of greater magnitude than said first voltage level.

4. The combination as claimed in claim 1 including means connecting the drain region of one transistor of first conductivity type from said one well region to the drain region of one transistor of said second conductivity type for forming a first complementary inverter, and means connecting the drain region of one transistor of first conductivity type from said second well region to the drain region of one transistor of said second conductivity type for forming a second complementary inverter, means for applying to said first complementary inverter signals varying between said first voltage level and said reference potential for producing output signals applied to said second inverter, said output signals varying between said first voltage level and said reference potential and said second complementary inverter producing in response to the output signals of said first complementary inverter signals varying between said second voltage level and said reference potential.

5. A complementary field-effect integrated circuit having various portions operated at different operating potentials relative to a reference potential, with at least two of the portions operated at said different potentials being coupled to each other comprising:

a semiconductor body of first conductivity type having embedded therein regions of second conductivity type for forming the sources and the drains of transistors of second conductivity type with a control electrode formed over the region between the source and drain of each transistor, said semiconductor body being the substrate of the transistors formed therein;

at least one well region per each said different operating potential, each one of said well regions being of second conductivity type and being embedded within said semiconductor body with regions of first conductivity type embedded within said well regions for forming the sources and the drains of transistors of first conductivity type, said well regions being the substrates of the transistors formed therein;

means for applying each said different operating potential to a different one of the well regions, and the reference potential to the semiconductor body;

means for applying to the source of each transistor the same potential that is applied to the semiconductor body or well region in which it is formed for preventing a potential differential between the source and the substrate of each and every transistor in said circuit; and means coupling one portion of the circuit operated at one potential to another portion operated at a different potential including means coupling said one portion to the control electrodes of the transistors in said another portion formed in said semiconductor body which serves as the point of reference potential.

6. An integrated field effect transistor circuit for translating signals produced by a first circuit operated from a first source of operating potential to a second circuit operated from a second source of different operating potential, comprising:

first and second inverters, each inverter comprising a first transistor of first conductivity type and a second transistor of second conductivity type; each transistor having a substrate and source and drain region defining the ends of a conduction path within its substrate and a control electrode for varying the conductivity of its conduction path, said transistors of first conductivity type sharing the same substrate region; said transistors of said second conductivity type having different substrate regions, electrically isolated from each other;

means connecting the gate electrodes of the two transistors of said first inverter in common to said first circuit; means connecting the source and substrate of said first transistor of said first inverter to a first node; means connecting the source and substrate of said second transistor of said first inverter to a second node; and means connecting the drains of the two transistors in common at a first output point; means connecting said first source of operating potential across said first and second nodes;

means connecting the gate electrode of at least one of said two transistors of said second inverter to said first output point; means connecting the source and substrate of said first transistor of said second inverter to said first node and means connecting the source and substrate of said second transistor of said second inverter to a third node;

means connecting said second source of operating potential across said first and third nodes; and means connecting the drains of said first and second transistors of said second inverter in common to said second circuit for supplying to said second circuit signals having a maximum amplitude equal to that of said second source of operating potential in response to input signals from said first circuit having a maximum amplitude equal to that of said first source of operating potential.

7. In a complementary symmetry semiconductor circuit, a circuit for coupling one portion of the circuit operated at one voltage level to a second portion of the circuit operated at a second different voltage level comprising, in combination:

a substrate of one conductivity type having therein source and drain regions of opposite conductivity type forming transistors of said opposite conductivity type, said source regions being connected to said substrate;

at least two semiconductor wells in said substrate formed of material of said opposite conductivity type and each having formed therein the source and drain regions of at least one transistor of said one conductivity type, each source region being connected to its well, respectively;

means for maintaining said substrate and the source electrodes formed therein at a reference voltage level;

means for maintaining one of said wells and said at least one source electrode formed therein at said one voltage level; and means for maintaining the other of said wells and said at least one source electrode formed therein at said second voltage level.

* * * * *

UNITED STATES PATENT OFFICE
CERTIFICATE OF CORRECTION

PATENT NO. : 3,916,430
DATED : October 28, 1975
INVENTOR(S) : Robert Charles Heuner et al.

It is certified that error appears in the above-identified patent and that said Letters Patent are hereby corrected as shown below:

Column 1, line 28, change "11, 12" to ---I1, I2 ---.
line 29, change "13" to --- I3 ---.
line 34, change "12 and 13" to --- I2 and I3 ---.
Column 4, line 1, change "priot" to --- prior ---.

Signed and Sealed this
*sixteenth* Day of *March 1976*

[SEAL]

*Attest:*

RUTH C. MASON
*Attesting Officer*

C. MARSHALL DANN
*Commissioner of Patents and Trademarks*